United States Patent [19]

Welsh

[11] Patent Number: 4,542,784

[45] Date of Patent: Sep. 24, 1985

[54] RETENTION AND COOLING OF PLUG-IN ELECTRONIC MODULES IN A HIGH SHOCK AND VIBRATION ENVIRONMENT

[75] Inventor: James W. Welsh, San Diego, Calif.

[73] Assignee: Planning Research Corporation, McLean, Va.

[21] Appl. No.: 600,077

[22] Filed: Apr. 13, 1984

Related U.S. Application Data

[62] Division of Ser. No. 364,452, Apr. 1, 1982.

[51] Int. Cl.[4] .......................... F28F 7/00; H05K 7/20
[52] U.S. Cl. .............................. 165/80 B; 29/157.3 D; 165/46; 165/80 C; 165/170; 165/183; 165/185; 211/41; 361/385; 361/386
[58] Field of Search ............ 211/41; 165/80 B, 80 C, 165/46, 170, 183, 185; 361/385, 386; 29/157.3 D

[56] References Cited

U.S. PATENT DOCUMENTS

| | | | |
|---|---|---|---|
| 2,107,031 | 2/1938 | Evans | 165/183 |
| 3,226,602 | 12/1965 | Elfving | |
| 3,268,772 | 8/1966 | Kamei et al. | |
| 3,495,657 | 2/1970 | Keith | 165/170 |
| 3,812,402 | 5/1974 | Garth | |
| 3,865,183 | 2/1975 | Roush | 361/385 |
| 3,946,276 | 3/1976 | Braun et al. | |
| 3,992,653 | 11/1976 | Richardson et al. | |
| 4,096,547 | 6/1978 | Calabro | |
| 4,214,292 | 7/1980 | Johnson | |
| 4,283,754 | 8/1981 | Parks | |
| 4,285,397 | 8/1981 | Ostbo | 165/170 |
| 4,337,499 | 6/1982 | Cronin | 361/385 |

FOREIGN PATENT DOCUMENTS

| | | | |
|---|---|---|---|
| 1120464 | 3/1982 | Canada | 29/157.3 D |
| 860569 | 2/1961 | United Kingdom | 29/157.3 D |

Primary Examiner—Douglas Hart
Attorney, Agent, or Firm—Cushman, Darby & Cushman

[57] ABSTRACT

Method and apparatus are disclosed for selectively clamping the edges of electronic modules into mechanical and thermal contact with a fluid coolant circuit. A stack of plural substantially parallel and generally planar fluid conduit-containing structures having spaced apart parallel legs jointly receive a stack of plural generally planar electronic modules disposed transversely therewithin. Each of the fluid conduit-containing structures includes mechanical/thermal contact pads disposed approximately perpendicular to its general plane on the inside edges of the parallel legs with the pads on some of the structures being directed one way and those on others of the structures being directed in an opposite way. At least one such set of structures is then collectively moved so as to selectively clamp the edges of the stack of electronic modules between opposingly directed contact pads. A special type of fluid conduit-containing structure formed by bonding two or more elongated sheets of spring metal along the boundaries of mating indentations is preferably employed with at least portions along one edge of the bonded sheets comprising the structure being oppositely bent up into individual and/or into pairs of spring pads to realize the contact pads just discussed.

10 Claims, 21 Drawing Figures

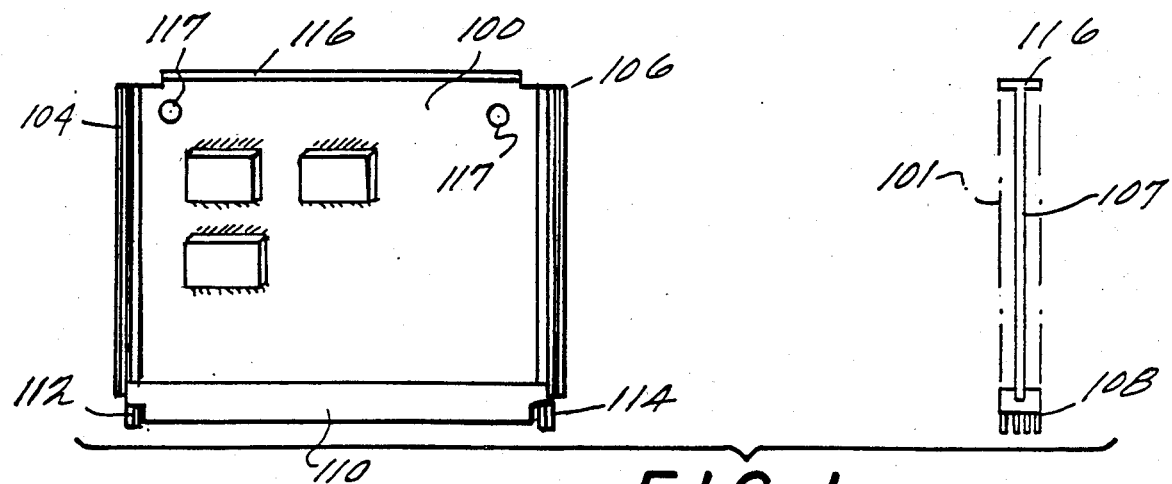
FIG. 1
(PRIOR ART)
TYPICAL STANDARD ELECTRONIC MODULE (SEM)
FIG. 2
(PRIOR ART)
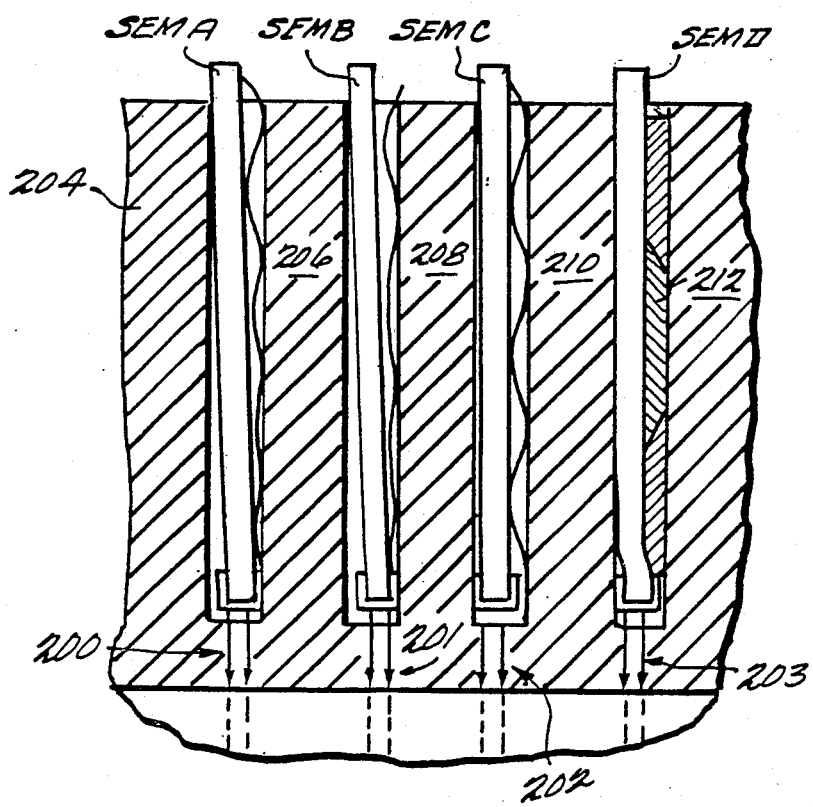

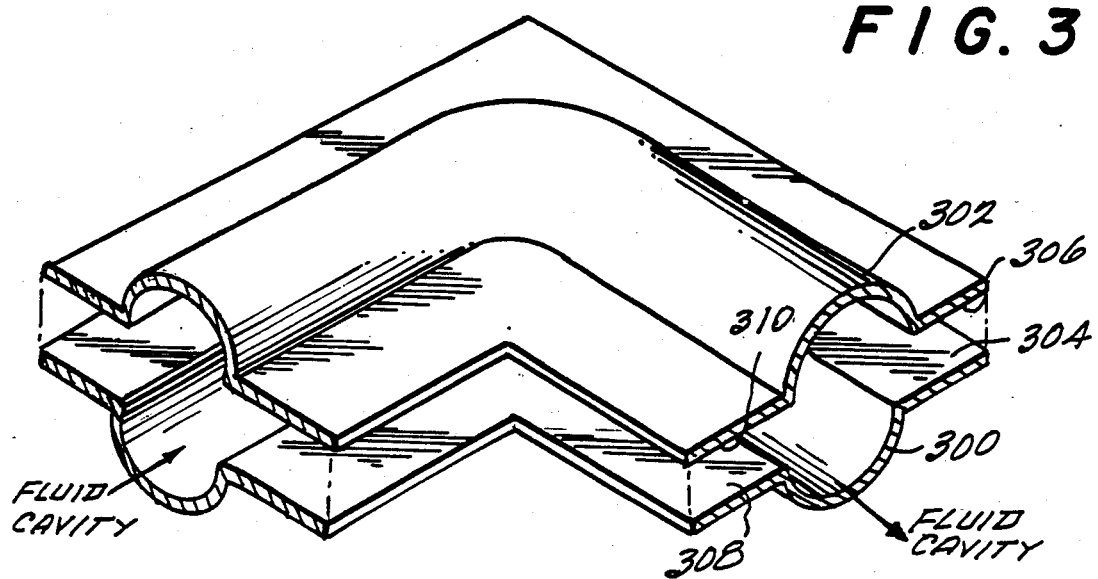
FIG. 3
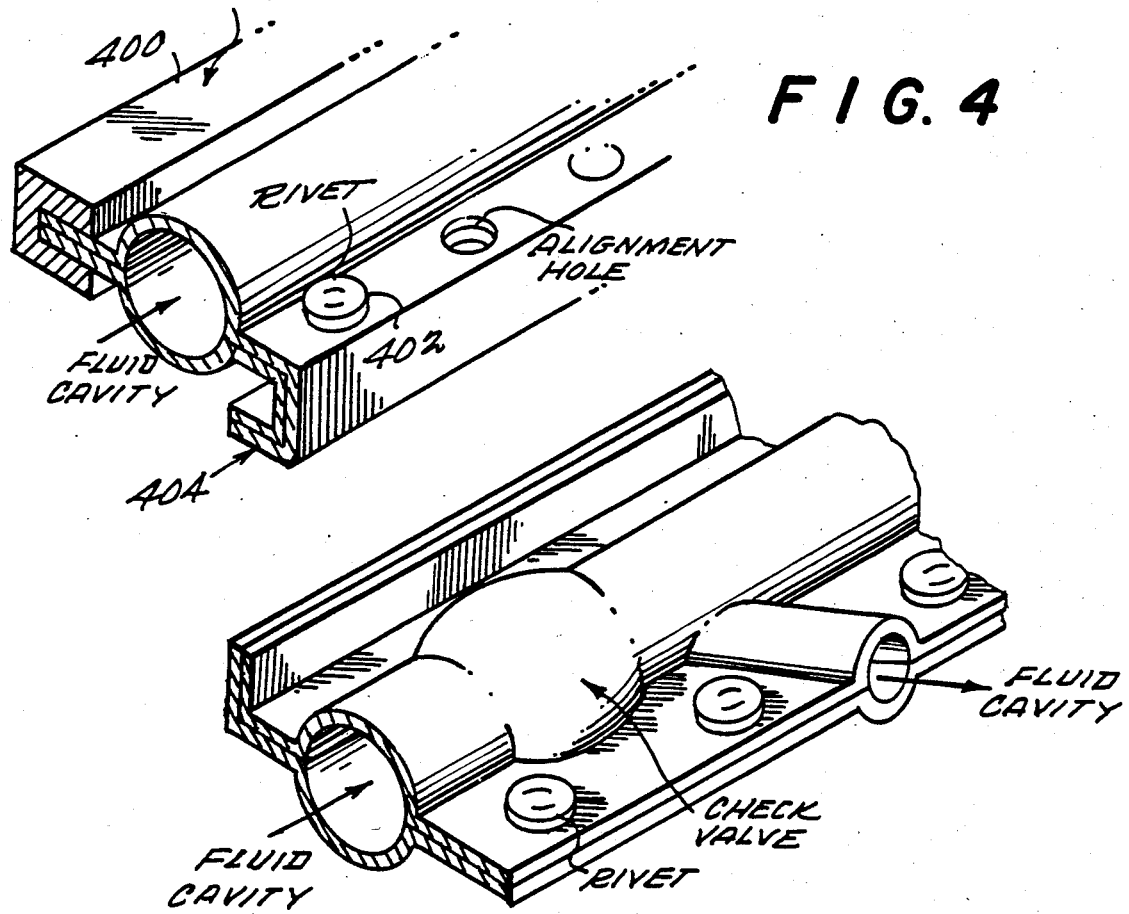
FIG. 4
FIG. 5

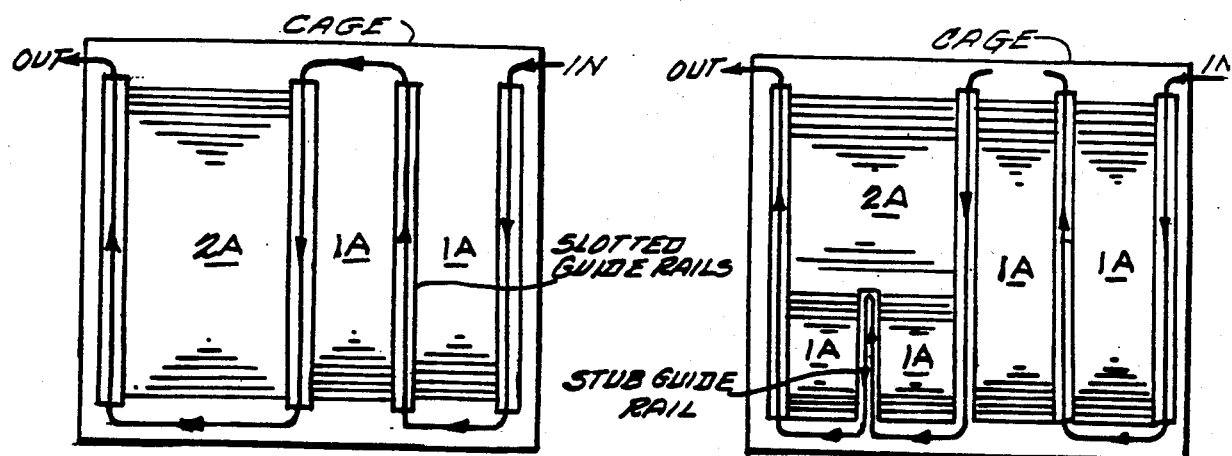
FIG. 12 (PRIOR ART)
FIG. 13 (PRIOR ART)
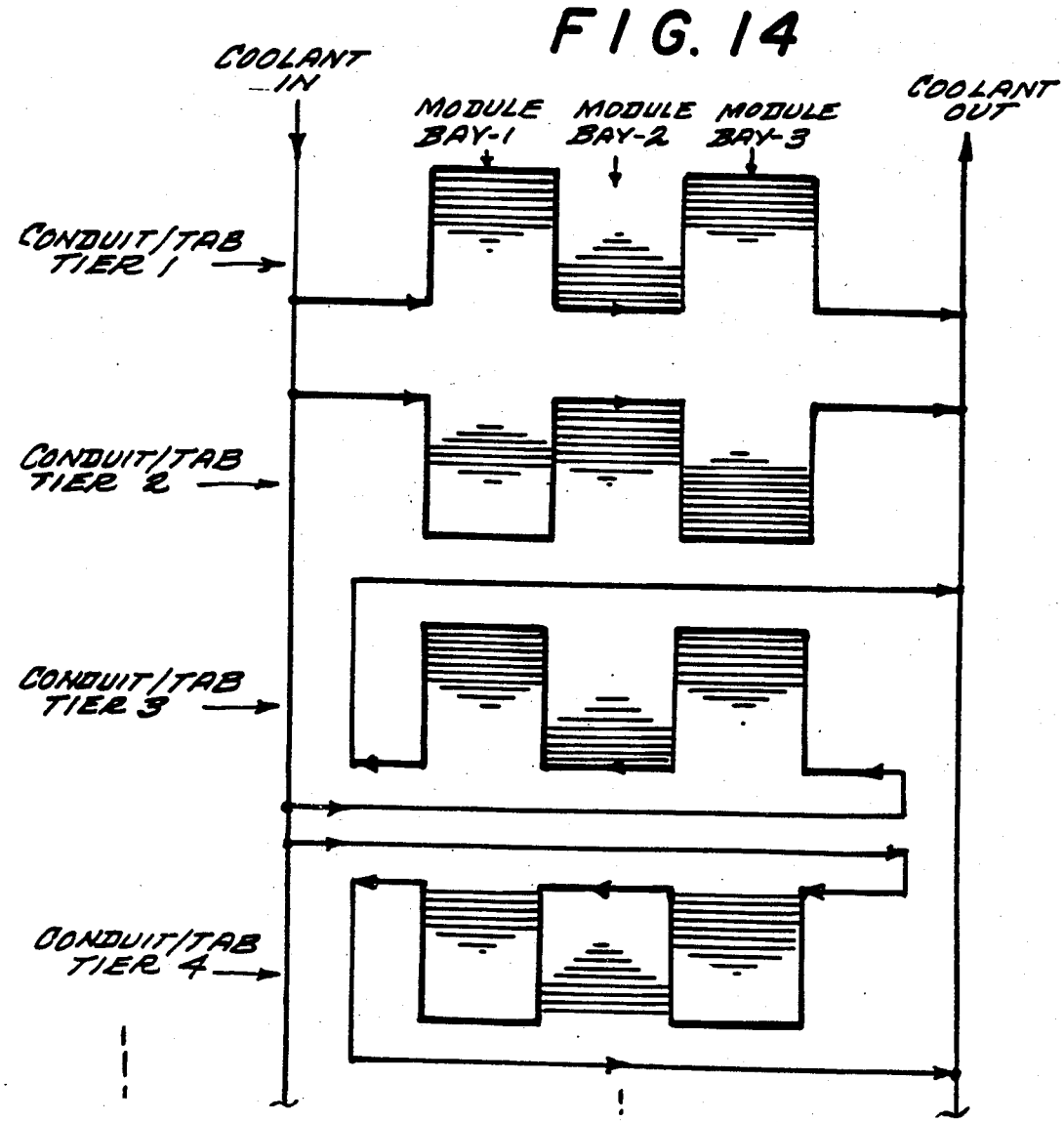
FIG. 14

FIG. 17
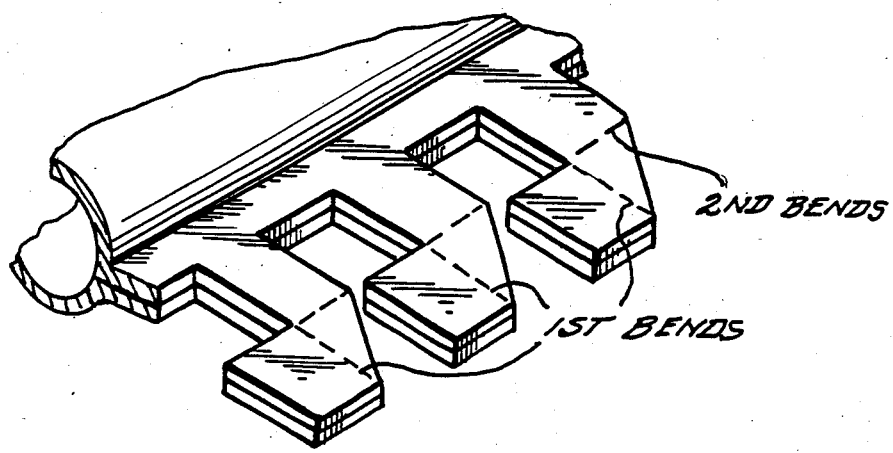
FIG. 18 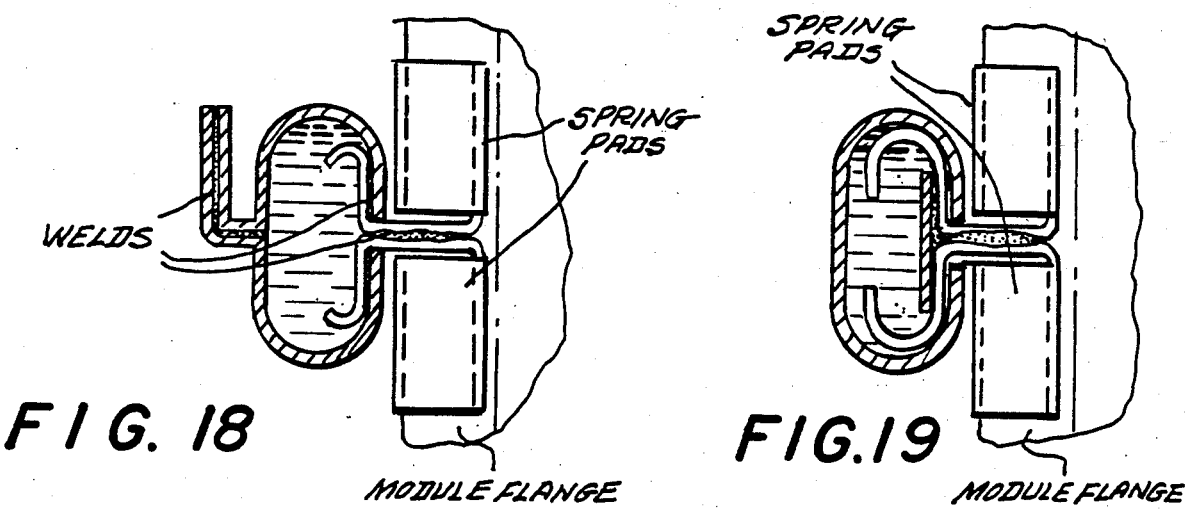 FIG. 19
FIG. 20A 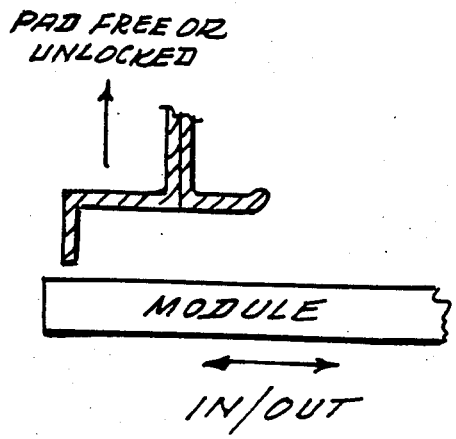 FIG. 20B 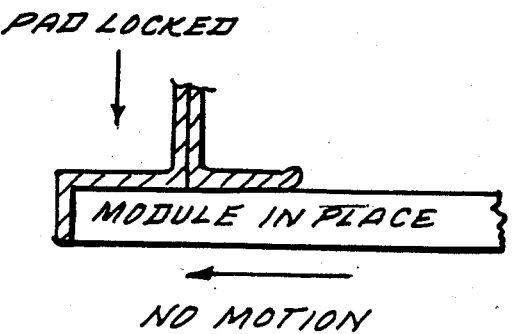

RETENTION AND COOLING OF PLUG-IN ELECTRONIC MODULES IN A HIGH SHOCK AND VIBRATION ENVIRONMENT This is a division of application Ser. No. 364,452 filed Apr. 1, 1982.

This invention is generally directed to method and apparatus for retaining and cooling plug-in electronic modules.

Electronic components of both the discrete and integrated circuit type have long been connected together in related electronic circuit structures on a modular basis with many different such modules then being plug connected to form overall systems of computers, navigation equipment, etc. Typically, the electronic components are mounted on a printed circuit board or the like which has pin connectors at one or more edges of the circuit board. While it is, of course, advantageous to facilitate easy removal and/or insertion of such modules into an overall frame, chassis or "card cage" during the original manufacturing process and/or during field testing, servicing and/or modification functions, these modules must typically be securely retained in a desired position during normal use in sometimes violent environments. Clearly, the electrical pin connections to other modules or circuit elements must be maintained securely during all operating conditions. In addition, such modules must be mechanically retained not only to help maintain the required electrical connection but also to prevent structural or collision damage to the electronic components on that or other modules.

As is also well known, some electronic components within any given module are a source of heat during normal operation and such heat is often detrimental to the electrical performance characteristics of those same components or to juxtaposed heat sensitive components if it is not properly removed or conducted to an appropriate heat sink capable of properly dissipating this unwanted thermal energy. In earlier days, convection air currents (either forced or natural) were often relied upon for transferring heat from the electronic components to an appropriate heat sink (e.g., the ambient atmosphere). However, as the density of components within a given module and the density of module packing within a chassis frame or "card cage" increases, simple cooling by impinging air currents is often inadequate. In addition, where forced air currents are used considerable undesirable conducted noise is generated by blower motor bearings and in the immediate environment of the electronic equipment by the moving air and blower blades or impellers.

Accordingly, conductive cooling, often using a liquid coolant, has become a more common technique for cooling such electronic modules. Typically, the modules each include solid heat conductors or the components are mounted on heat conducting frames for efficiently conducting heat from within or on the module to an outer edge of the module frame where the heat conductor(s) are exposed for thermal contact with other heat conducting circuitry so as to ultimately and efficiently conduct the unwanted thermal energy away from the electronic equipment and into an appropriate heat sink provided for that purpose.

Ideally, some means should be provided for positively mechanically retaining the plug-in electronic modules while simultaneously conductively cooling them in high shock and vibration operating environments. When installing, removing or replacing the modules except for electrical pin/socket connection friction forces, there should be substantially zero insertion/removal resistive frictional forces. An at least partial listing of ideal characteristics of a system for retention and cooling of plug-in electronic modules is summarized below:

1. In normal use, high clamping forces and generous smooth contact-bearing areas should be provided across all mechanical/thermal discontinuities so as to achieve a satisfactory thermal conductive path (the lowest possible thermal resistances) between a liquid coolant, for example, and the heat source within the electronic modules.

2. Other factors being equal the shorter the conductive paths, the more efficient the transfer of heat away from its source to the ultimate sink.

3. Where imperfect surfaces are present on either side of a mechanical/thermal discontinuity, several independent alternate conductive paths may be preferable to only one or a few.

4. Relatively high mechanical retention forces although not necessarily inflexible are also desired during normal usage so as to positively retain the modules in their desired physical position during exposure to adverse physical environments.

5. The clamping forces provided to satisfy the first two criteria should be easily releasable on demand so as to facilitate easy removal or replacement of one or more plug-in modules. For example, so as to permit periodic updating of electronic circuitry, it may be desired to replace a whole group or block of adjacent plug-in modules all at one time—possibly without separating them from their electrical pin connectors including the pin-to-pin wiring or other back plane interconnecting circuitry—and without disturbing the liquid cooling circuit or any of the other modules or wiring located within the same chassis or frame and only momentarily interrupting the cooling capability for those other modules.

6. A minimum number of fluid joints or connections is desirable so as to minimize the possibility of leaks in the liquid coolant conduit under dynamic stresses and/or mechanical deformation of the system.

7. Preferably, no dissimilar metals or materials subject to corrosion should be exposed to the liquid coolant or used in the coolant plumbing circuit so as to maximize longevity and reliability.

8. A minimum number of mechanical/thermal discontinuities should be present in the paths between the module thermal conductive flange surfaces and the liquid coolant so as to achieve the most efficient heat transfer.

9. A multiplicity of thermal paths are more likely to assure good contact than one or a few.

As the packing densities of high power electronic components and modules continues to increase and service environments become more severe, it is becoming even more apparent that currently available method and apparatus for retaining and cooling plug-in electronic modules provide an ever increasingly inadequate simultaneous solution to such ideal design criteria. At the present time, such inadequacy is becoming apparent, for example, with respect to the so-called "standard electronic module" (SEM) and/or the so-called "improved standard electronic module" (ISEM) families of plug-in electronic modules now used and/or proposed for general use in the extreme environment encountered in military electronic systems. While the present exemplary embodiment is therefore explicitly directed to such SEM/ISEM applications, it will be appreciated that the innovative design concepts which are here disclosed are equally applicable to any similar plug-in electronic module or other heat producing or heat sensitive assembly which requires conductive transfer of generated heat from its functional components through heat conducting surfaces located at the perimeter of the device (which may also serve partially as guiding or supporting flanges) into a circulating and/or recirculating fluid coolant or the like also in thermal contact with an ultimate heat sink (e.g., a liquid-to-air heat exchanger in contact with the ambient air).

Effective utilization of space and minimization of structure-borne and airborne noise have long been primary considerations in the design of military electronics. Accordingly, liquid coolant in combination with thermal conductors has already been proposed and is used extensively in military electronic applications. The higher cost is readily justified, for example, by the more effective space utilization and the virtual elimination of any additional structure-borne or ambient noise when compared to air impingement, radiation/convection systems of comparable heat removal capacity. Conductive transfer to a liquid coolant also eliminates the ingestion of all kinds of airborne contaminants which tend to compromise electrical performance and promote corrosion. However, many such prior thermal conductive cooling systems have typically been realized by bolting together leakage prone fluid coolant conduit structures comprising drilled or otherwise milled passages in many stiff solid members (possibly with attached cover plates to contain the coolant) or embedding of conventional continuous wall copper tubing circuits or the like to direct coolant liquid through rigid guide rails or cold plates which are supposed to mechanically and thermally engage via fixed slots and/or springs or wedges the thermally conductive edge flanges of SEM/ISEM electronic modules. The following prior issued United States patents typify some of the prior approaches used for retention and cooling of electronic modules:

U.S. Pat. No. 3,226,602—Elfving (1965)
U.S. Pat. No. 3,992,653—Richardson et al (1976)
U.S. Pat. No. 4,283,754—Parks (1981)
U.S. Pat. No. 3,946,276—Braun et al (1976)
U.S. Pat. No. 3,268,772—Kamei et al (1966)
U.S. Pat. No. 4,214,292—Johnson (1980)
U.S. Pat. No. 4,096,547—Calabro (1978)
U.S. Pat. No. 3,812,402—Garth (1974)

Elfving teaches a heat transfer mounting panel for electronic components and circuits which is constructed from mating halves of aluminum sheets stamped or otherwise formed to include depressions which, after the mating sheets are joined, form liquid coolant passageways. Richardson et al teach a zero insertion force electronic module card guide which permits quick and easy insertion/removal of a heat conducting module edge designed for intimate thermal contact with a heat exchanger surface. A lever activated cam arrangement is used for simultaneously applying or releasing spring force on a plurality of module edges. Parks teaches a cooling system for assembling multi-wafer high density integrated circuit chips that are stacked together with interleaved connection chips and thermal conductors. Braun et al use a spring and frame mechanism to maintain a covering heat dissipation plate over an integrated circuit in thermal contact both with the integrated circuit structure and with adjacent fluid coolant conductors. Kamei et al, Johnson and Calabro all utilize various spring arrangements for maintaining mechanical and thermal contact along the edges of a printed circuit board or other electronic module. Garth actually teaches immersion of an entire system of electronic modules in a liquid coolant. None of such prior art is believed to provide an optimum solution to the problem presented.

Now, however, a unique method and apparatus have been discovered which are believed to provide a more nearly optimum solution to the above-discussed design criteria than ever before possible. For example, the unique method and apparatus of this invention simultaneously:

(a) retains the cooling liquid ultimately connected to a heat sink as close as possible to the plug-in module, (b) with a multiplicity of resilient contact pads mechanically engages each module in a very secure manner along multiple edge surfaces so as to securely hold it in a vibration or high shock environment, (c) provides thermal contact between the independently compliant multiple contact pads and all of the available surfaces on the edge of the module with the same metallic surface which touches the module used for containing the fluid coolant, and (d) yet permits easy cam-operated mechanical action to simultaneously engage or disengage the multiple mechanical/thermal contact pads from all of the modules in the frame or card cage so that any number of modules may be removed/installed together with their back plane wiring, or any number of modules may be individually removed/installed merely by overcoming the minimum force required to engage/disengage the electrical plug connectors on each of them individually.

The design of the exemplary fluid coolant conduit used in this invention is itself believed to be unique. First of all, the material used for the conduit is chosen for its thermal conductivity, corrosion resistant, formability and mechanical spring characteristics. For example, beryllium-copper is one suitable material. Various stainless steels may be as good. Secondly, such material can be formed in identical mating halves by relatively inexpensive stamping or other conventional forming techniques. Thirdly, the extreme outside portions of such mating halves can be further formed by bending into pairs of spring pads. Fourthly, the very same surface of the metal conduit structure which, in one place, will retain and conduct the fluid coolant will, in another place, only a short distance away be exposed to mechanical/thermal spring contact with the available edge surfaces of an electronic module. Finally, the formed beryllium-copper halves are then permanently joined together so as to create a one-piece fluid conduit the boundaries of which provide integral compliant contact pads. One embodiment provides integrally formed spring contact pads which not only engage opposite side faces at the perimeter but bear against the extreme outside edge and/or frame shoulders of the electronic modules as well.

These pads are preferably formed in this manner at regular intervals consistent with the module-to-module spacing in an array on a first conduit tier. Multiple such conduit tiers are then arrayed (i.e., stacked one behind the other) in a transverse direction and oriented such that adjacent tiers have their mechanical/thermal contact pads oriented (facing) in opposing directions. Stated somewhat differently, alternate stacked conduit tiers have commonly directed mechanical/thermal contact pads. Such alternate stacked conduit tiers are then mechanically displaced a pair at a time or as many pairs as are feasible at the same time or all simultaneously considering the number of tiers, aggregate clamping forces, the number of modules and mechanical advantages available in the actuating devices. Mechanically gang-connecting the tiers moves a first set of alternate tiers in one direction while a second, interleaved, set of alternate tiers moves in the opposite direction upon actuation of an activating lever and cam arrangement. Alternatively, one set of tiers can remain fixed while only the other set of tiers is moved. The number of tiers in either set may vary.

Accordingly, to insert an electronic module, the two interleaved oppositely facing sets of tiers are moved in opposing directions (or one of the sets is moved with respect to the other) so as to increase the space between their respectively aligned but opposingly directed mechanical/thermal spring contact pads. This movement is preferably just sufficient to permit a minimally obstructed insertion of the module edges while offering an appropriately spaced guide for the module in its passage therebetween as it is inserted in its electrical pin/socket connection on a card cage, chassis, frame or the like. After thus guiding the module into its electrical connection, the two alternate sets of oppositely facing tiers are then physically moved in opposite senses (or the one movable set is moved in an opposite sense with respect to the other set) so as to close the space between the oppositely facing spring pads. Ultimately, the converging spring pads mechanically and thermally clamp the thermal conductive edges of the electronic module. Removal then requires prior movement of one or both of the sets of tiers as described for insertion above so as to again release the grip on the modules and increase the space between opposing spring contact pads.

In accordance with this invention, method and apparatus are provided to selectively clamp the edges of an array of plural electronic modules into mechanical and thermal contact with a proximate fluid coolant circuit. In the exemplary but non-limiting embodiment, a stack of plural substantially parallel and generally planar fluid conduit-containing structures is provided. Each of these structures has spaced-apart parallel legs for jointly receiving a stack of plural generally planar electronic modules therewithin with the plane of the modules being disposed transversely of the planes of the conduit-containing structures. Each such conduit-containing structure is also provided with integral mechanical/thermal spring contact pads disposed approximately perpendicular to its general plane on the inside edges of these parallel legs. The contact pads are directed in one direction on some of these structures and in an opposite direction on the others. At least one set of such structures having commonly directed contact pads is then capable of selective movement (singly or as a set) so as to clamp the edges of the electronic modules between the opposingly directed contact pads on the other set of structures.

The exemplary coolant fluid conduit used in the exemplary embodiment is formed from two or more elongated sheets of thermally conductive spring metal permanently bonded together along the boundaries of mating elongated indentations so as to create a fluid conduit therewithin. In addition, at least one side of the edges of these sheets along such a conduit will have previously been formed or bent into pairs of spring pads at regular intervals. Preferably, two spaced-apart substantially parallel conduit legs, each of which includes substantially coplanar pairs of such spring pads are integrally formed by the two elongated sheets of spring metal. Beryllium-copper or stainless steel being suitable spring metals for this purpose either of which can further be nickel plated to improve its surface and thermal interface characteristics.

These as well as other objects and advantages of this invention will become more clearly apparent by reading the following detailed description of the presently preferred exemplary embodiment of the invention taken in conjunction with the accompanying drawings, of which:

FIG. 1 depicts a typical prior art Standard Electronic Module (SEM) having thermally conductive interface areas along two of its edges;

FIG. 2 diagrammatically depicts typical problems encountered with prior art arrangements designed to make thermal contact with the edges of an electronic module;

FIG. 3 is a perspective exploded view of a portion of a fluid conduit (without its conductive spring pads being shown) manufactured in accordance with this invention;

FIG. 4 is an exemplary alternate embodiment of the conduit shown in FIG. 3;

FIG. 5 is yet another exemplary alternative of the conduit shown in FIG. 3;

FIGS. 12-13 depict typical fluid flow patterns through prior art coolant conduits for card cage, frame or chassis arrangements;

FIGS. 14 depicts an improved exemplary fluid flow pattern made possible by this invention which makes module cooling less dependent upon module position within the card cage or frame;

Figure 7:
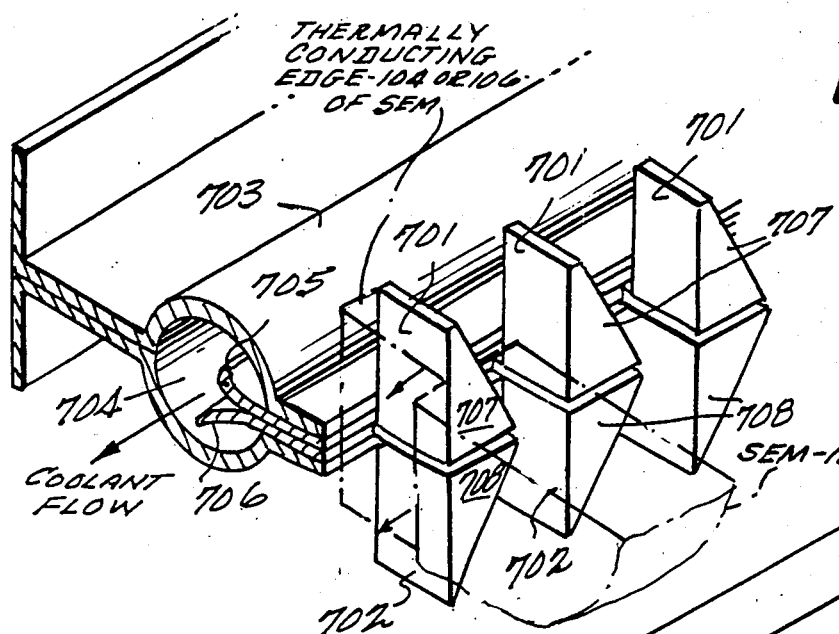
FIG. 7 is yet a further exemplary alternative of the conduit shown in FIG. 3 but including integrally formed mechanical/thermal spring contact pads depicting different bend lines formed in a second set of metal sheets which enter into direct thermal contact with the fluid flowing in the conduit.

FIG. 17 includes a depiction of the metal flat pattern and a bending process used in typical manufacture of an embodiment similar to that illustrated in FIG. 7;

FIGS. 18 and 19 are cross-sectional views of alternate conduit structures which provide increased strength and resistance to tearing forces generated by fluid pressure; and FIGS. 20A and 20B illustrate the manner in which the end of a module may be positively retained in high-shock environments by an end-retention portion on the contact pads in the last tier of conduit structures.

A typical Standard Electronic Module (SEM) of a type curently used is shown in FIG. 1. Discrete state-of-the-art electronic components including integrated circuit components are attached to a central structural/thermal frame 100 or housed within an outer limiting dimension 101. Conventional thermal conductors may be provided or the printed circuit components mounted directly onto the module frame and connected so as to efficiently transfer heat to the external thermal conducting areas 104, 106 provided at either end of the SEM. Typically, such thermal interface areas are provided on both sides of the frame and possibly on the extreme outer edge 107 at both ends as well as to make three heat transfer surfaces on each end of the module as will be appreciated. Standard electrically conductive pin connectors 108 are provided within an outer protective housing 110 or along the base perimeter of a central frame for conventional electrical connection to mating electrically conducting sockets mounted within a card cage, frame or chassis as should also be apparent. In SEM/ISEM coding pins 112, 114 may be provided to prevent insertion of any module into any connector other than the one for which it is intended. In other formats they help ensure alignment between the pin connectors 108 and their mating socket counterparts within the fixed card cage, etc. A flange 116 is typically provided at the outside edge of the card to facilitate identification and two holes 117 are furnished to aid mechanical insertion/withdrawal of the SEM from a card cage. Originally this flange presented additional heat transfer surface to air flowing over the module.

The configuration of SEM/ISEM connectors requires a relatively tight location and perpendicularity tolerance on pin-to-pin and row-to-row dimensions. This makes the SEM/ISEM modules themselves precision devices. However, the SEM/ISEM modules to be assembled within a commom card cage are often manufactured by different organizations and/or by different facilities within a given organization. By the time the connector back plane in the card cage, frame or chassis, the guide rails and SEM/ISEM modules all come together in a working assembly, even very small deviations from the restrictive dimensioning of the constituent assembly parts result in less than perfect alignments between these various separately manufactured items.

Originally, SEM-based systems were intended to be cooled by air impingement/radiation across the top edges of the modules. Accordingly, the objective of the dimensioning scheme employed was primarily to ensure proper alignment of the multiple pin and socket electrical connectors. At this time, the only function of the SEM edge flanges was to provide a guiding sliding interface with corresponding slots in a frame guide rail. Good thermal connection was not then a factor.

When conductive cooling of the guide rail became necessary (e.g., by providing liquid-coolant conduit in thermal contact with or internal to the guide rails), a series of spring devices were introduced in an attempt to force the module flanges against at least one side of the slot in the guide rails. However, even relatively large spring loading forces which substantially impede insertion/removal do not necessarily ensure a satisfactory thermal interface in this particular configuration. For example, the module location is ultimately controlled more by the electrical connector/pin relationship than by the guide slots. It is virtually impossible in a large SEM/ISEM assembly (say an 18×21-inch frame with six rows of guide rail slots every 0.3 inch) to precisely match a separately manufactured connector panel having 15,120 individual connector holes and to install up to 378 SEM/ISEM modules manufactured by perhaps a dozen different contractors and have every one of the 756 slots involved still aligned perfectly with both ends of each of the 378 modules.

To help illustrate the problem, FIG. 2 diagrammatically depicts several typical situations. It should be understood that this depiction is only intended to help explain the difficulty involved and does not necessarily correspond exactly with any particular existing structure. As shown in FIG. 2, SEM/ISEM modules A, B, C and D have their frames dimensionally fixed with respect to one another by the electrical pin and socket connectors 200, 201, 202 and 203. One side of the SEM/ISEM module frame is supposed to be in contact with respective sides of the slots in the guide rail 204, 206, 208 and 210. A representative positive displacement wedge lock 212 shown forcing SEM module 203 against the slot 210 may induce bending at the pin connector interface.

However, only the oppositely facing side thermally conductive areas at the edges on modules 200, 201 and 202 will typically only engage the guide rail slot surface at one point or line of contact and that only on one side of the module frame. That is, unless absolutely perfectly aligned (as represented by SEM device C in FIG. 2), the spring will force the SEM/ISEM module to tip or bend until it touches the slot at the topmost edge opposite the spring (as represented by SEM/ISEM module A in FIG. 2). Another possible condition occurs when the module is located so close to the spring that it cannot exert enough force to push the top of the flange against the slot at any contact point or line (represented by SEM device B in FIG. 2). This latter situation results particularly after the spring has relaxed. Even if an occasional module is perfectly aligned in parallel with the slot surface (as represented by SEM device C in FIG. 2), the surfaces of most die cast and even some stamped module frames are not smooth enough to ensure that the entire available area is actually in thermal contact under spring loads.

Therefore, as a practical matter, a spring on one side of an SEM/ISEM module flange produces only a single line or point contact on the opposite side of the flange which typically represents the maximum thermal contact area. These limitations thermally degrade such prior art approaches where higher heat loads must be efficiently transferred to a heat sink. In addition, the use of such a constant spring loading materially increases the friction forces which must be overcome during manual insertion and/or removal of electronic modules. If spring forces in such prior art devices are to be sufficient for ensuring acceptable thermal efficiencies, they may be so high as to effectively prevent the insertion or removal of even a single SEM/ISEM module with up to 250 electrical pin connections being made at one time.

An exemplary fluid coolant conduit formed in accordance with this invention is shown in FIG. 3. Here, the coolant flow is confined in a conduit formed between two opposing pieces of thin copper-compatible and heat treatable spring metal (e.g., thin beryllium-copper sheet stock). The individual metal sheets are formed by stamping, hydro or explosive forming or similar conventional techniques so as to create indentations or channels 300, 302 corresponding to approximately one-half of the intended fluid conduit. The enclosed cross-section may take other than a cylindrical form. Mating edge surfaces 304, 306 and 308, 310 are provided along the boundaries of these indented areas so as to permit soldering, brazing or otherwise bonding or permanently joining the two mating pieces to form a closed passage. These bonded edge surfaces also serve to increase the bonded joint integrity and edge stiffness and provide additional mechanical rigidity to the overall structure. It will be observed that conduit formed in this way may be viewed as a substantially planar structure having included enlargements which form the conduits for passage of fluid coolants. If desired, the included enlargements may be formed wholly or to a greater extent in one of the metal sheets rather than in the other.

Additional insurance against mechanical separation of the two metallic sheets can be achieved by using extrusion clamp members (e.g., 400 as shown in FIG. 4), rivets (e.g., 402 as shown in FIG. 4), spot welds or other means for bonding the flanges along the boundaries of the fluid cavity. Matched alignment holes (as shown in FIG. 4) or matched dimpling of the mating metallic sheets help achieve precision interlocking and alignment of both halves of the structure before or during the bonding operation. Supplementary bending or forming operations (e.g., as shown at 404 in FIG. 4) can further ensure against separation and also increase bending resistance in other planes. Compared to bending, joining, interconnection and structurally supporting either cylindrical, rectangular or other cross-sectioned continuous walled copper tubing, this stamped sheet fabrication of the coolant fluid conduit is believed to be particularly advantageous and suitable to the electronic module cooling solution to be described hereafter. Using such stamped metallic sheets, conduit routing and transition shapes can be optimized for lowest pressure drop and cavity irregularities can be automatically incorporated in the conduit for internal control elements such as check valves (as illustrated in FIG. 5), flow regulators, etc.

Figure 8:
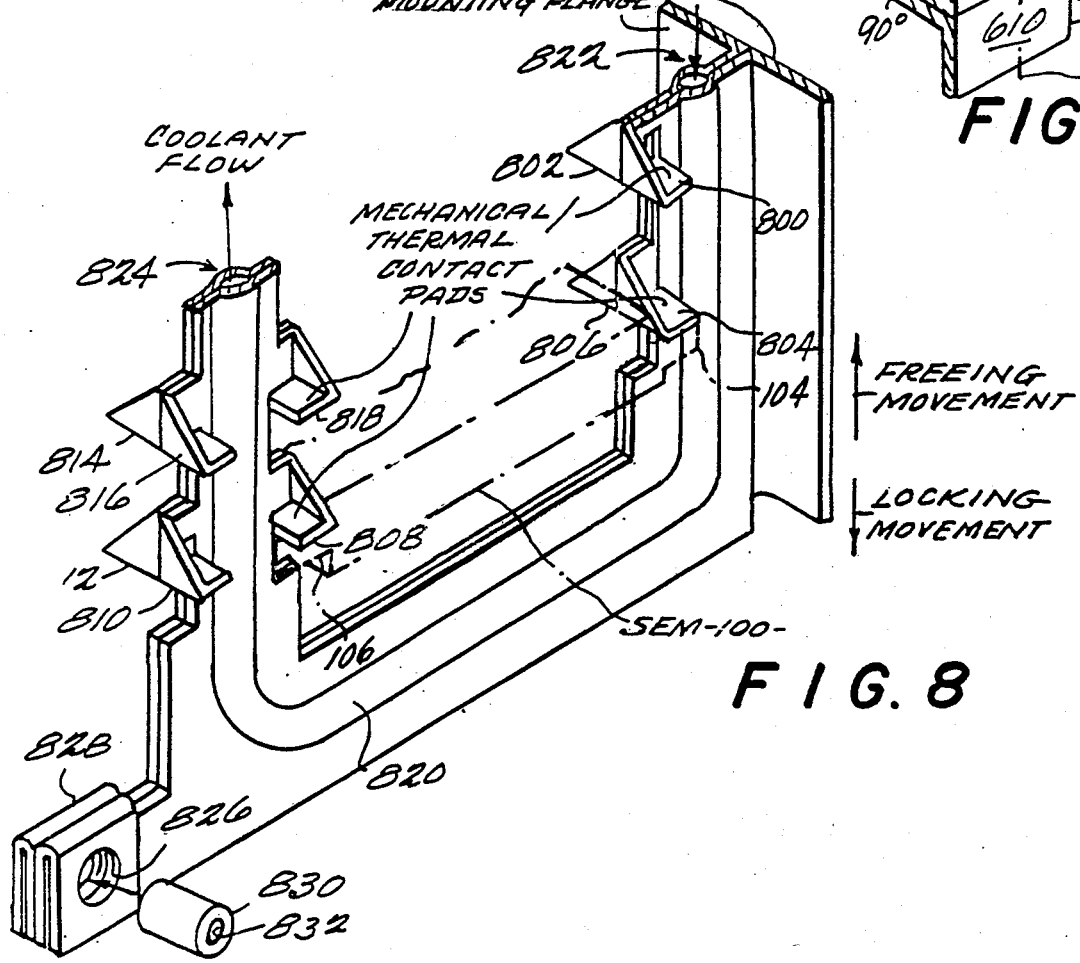
FIG. 8 is a partial perspective view of the end of one U-shaped generally planar conduit tier as in FIG. 6 with integrally formed mechanical/thermal contact pads as in FIG. 7 formed therein.

In accordance with this invention, mechanical/thermal contact pads are integrally formed immediately adjacent to the edge flanges of fluid conduits formed as just described. Some exemplary mechanical/thermal contact pad arrangements are shown in FIGS. 6–8.

Figure 6:
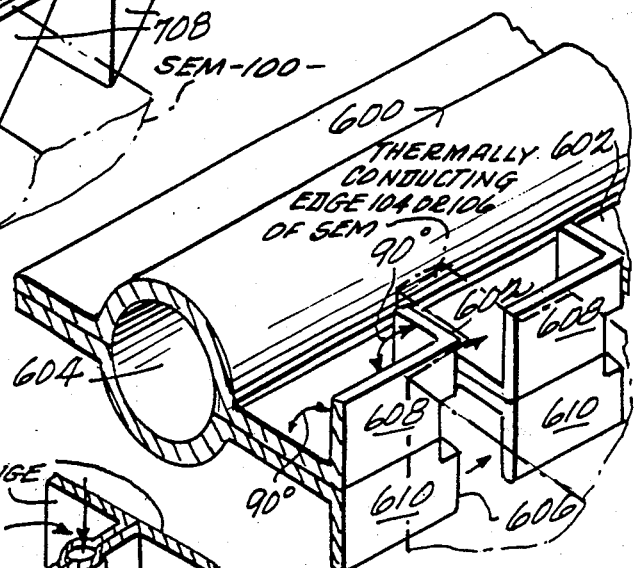
FIG. 6 is a perspective view of an alternative embodiment of the conduit shown in FIG. 3 with mechanical/thermal spring contact pads.

For example, at FIG. 6, the right-hand edge of the upper metal sheet used for forming the conduit 600 has successive cut-away portions which may be twice bent at 90° angles as shown so as to provide spring mechanical/thermal contact pad 602 with a surface directed as shown by the arrow in FIG. 6. Similarly, the edge of the lower metallic sheet 604 forming the conduit is cut-away at successive intervals and twice bent at 90° angles to form a second spring mechanical/thermal contact pad 606 oriented in the same direction as pad 602 as is also shown by an arrow in FIG. 6.

Typical bend lines are indicated in FIG. 17 for forming an array of mechanical/thermal contact pads along the edge of a conduit similar to the contact pads in FIG. 7.

Although not required, FIG. 7 depicts metal carrying the thermal spring pads 701, 702 bonded between an upper 703 and lower 704 metallic sheets comprising the coolant conduit. These additional metallic members 705, 706 extend into the fluid conduit so as to present the maximum available area for thermal contact with the coolant. As might be appreciated, while the thermal efficiency is thus improved, the pressure drop along the linear segment of the fluid conduit can be expected to increase with such additional increased resistance to fluid flow.

If one or more additional elements such as 705, 706 are employed, it should be noted that the edge as well as both adjacent faces of such additional elements are all directly exposed to the passage of the fluid coolant and that these additional elements are intimately clamped between two pieces of (preferably heavier gauge) copper alloy brazed or otherwise bonded together to form a much stiffer conduit. The portion of these materials exposed to fluid flow may be perforated, textured or otherwise specially formed to optimize laminar flow over the edges and/or adjacent face surfaces. They can also be irregularly shaped or contoured so as to introduce some optimum degree of turbulence should that be thought to optimize the heat transfer process in particular applications. The optimum design will involve trade-offs between fluid flow and fluid pressure versus heat transfer efficiency.

To minimize the required space for bonding closures (brazing, soldering, etc.) for the fluid conduit, a variation of the FIG. 17 embodiment as shown in FIGS. 18 and 19 may be used. The less space lost to structure between adjacent rows of plug-in modules, the better. The constructions shown in FIGS. 18 and 19 provide a better structural joint in less space. In effect, the bonded overlap surface is mostly oriented at 90° to the axis along which a minimum dimension is desired. Thus the bonded areas can be made larger and the "rip-apart" force vectors are such that increasing fluid pressure does not attempt to "peel" the bonded joint apart but, rather, tends to put the bonded joint in shear.

The bending technique for forming the mechanical/thermal contact pads as shown in FIG. 7 differs slightly from that shown in FIG. 6. In addition to the primary contact pads 701, 702, it should be noted that there are supplementary contact surfaces at 707, 708 also formed which, if desired and if properly dimensioned, may be used for at least partially engaging a shoulder surface of the module adjacent the usual heat transfer conduit on opposite sides of the edge of the module flange. Similarly, supplementary shoulder-engaging surfaces 608, 610 are, of course, also available in the embodiment of FIG. 6. Spring pads may be additionally provided which engage the outside edge of the module frame in accordance with the exemplary embodiment of FIGS. 15-16.

The presently preferred bonded two-piece fluid conduit as in FIG. 6 with integrally formed mechanical/- thermal contact pads as in FIG. 7 bent up along the edges of the conduit comprises a generally planar U-shaped arrangement as shown in FIG. 8. As will be appreciated from FIG. 8, the array of contact pads 800-818, etc., are formed in the manner illustrated at FIG. 7. In the embodiment of FIG. 8, there are no included additional metallic elements within the coolant conduit 820.

Thus, in the embodiment of FIG. 8, an outside first leg 822 of the coolant conduit is joined to an inside second leg 824 of the coolant conduit so as to form a generally U-shaped planar structure or tier. The contact pads 800/802, 804/806, 810/812, 814/816, etc., are generally formed in coplanar pairs transversely of the conduit tier plane. For example, pads 804/806 are generally coplanar as are pads 808 and its mate obscured in FIG. 8 (likewise, pads 800/802 and 818 and its mate also obscured). Accordingly, when generally planar electronic module flanges are inserted transversely of the planar conduit tier, they will be generally parallel to the contact pad surfaces. By moving the conduit tier of FIG. 8 downward, the mechanical pads may be brought into clamping engagement with such generally aligned electronic module thermal conductive surfaces. Opposite movement (upward in FIG. 8) will free or unclamp the same surfaces so that they may be freely inserted between the corresponding sets of contact pads. In the embodiment of FIG. 8, a special cam-following aperture 826 is provided within and integrally formed motion controlling stub 828 which includes a stack of sheet segments bent back upon one another and preferably bonded together and including a hardened bushing 830 together so as to provide a larger, more rigid and accurate cam-following aperture 832. As will be explained in more detail below, an appropriate cam may be used in conjunction with the aperture 832 to control the clamping and unclamping movements illustrated by arrows in FIG. 8 for one or more of the conduit tiers.

Figure 9:
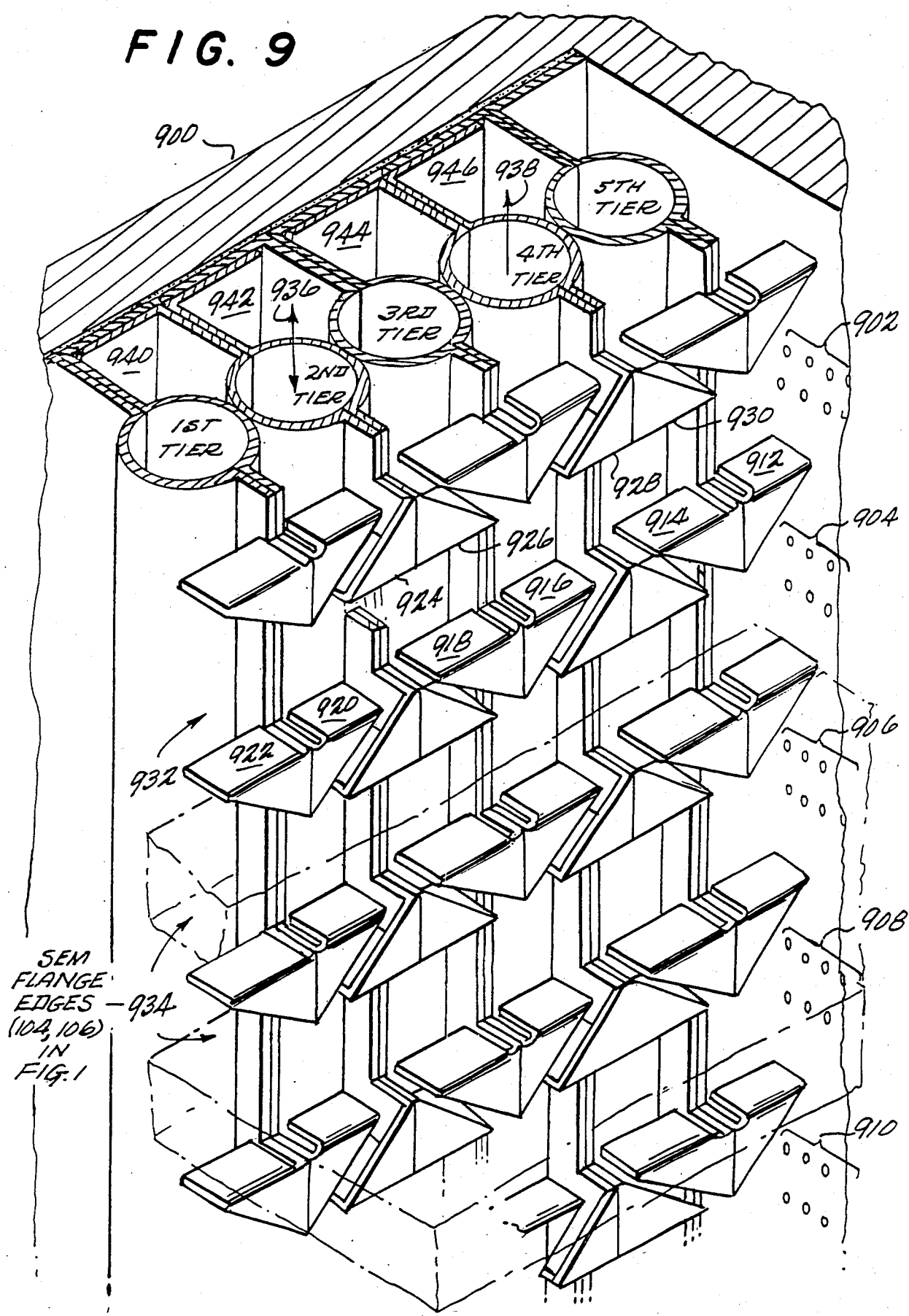
FIG. 9 is a partial cut-away perspective view of one side of an assembly of stacked conduit tiers as in FIG. 8 within a card cage, frame or chassis so as to selectively clamp or unclamp the thermally conductive edges of standard electronic modules inserted within channels formed by the opposingly directed mechanical/thermal contact pads of the stacked conduit tiers.

A system of oppositely facing stacked tiers individually corresponding to the tier of FIG. 8 is arranged at FIG. 9 within a card or module cage, frame or chassis 900. As will be appreciated, conventional electrical connector socket arrays 902, 904, 906, 908, 910, etc., are provided at the rear of the frame for electrical connection to the pin connectors of corresponding electronic modules. Five tiers of generally planar conduit structures are shown in FIG. 9 with their transversely oriented and integrally-formed contact surfaces. In the exemplary embodiment of FIG. 9, adjacent tiers have their contact pads directed in opposite directions. On the other hand, alternate tiers (e.g., front, middle and rear) have their contact pads directed in common directions. Thus, the six upwardly directed contact pads 912-922 and the four downwardly directed contact pads 924-930 define a channel 932 along which a thermally conductive edge or flange of an electronic module may be inserted so as to connect the pins at its back edge with the sockets 902. Although not shown in FIG. 9, the five tiers of this exemplary embodiment would have five corresponding parallel legs on the opposite side of the frame 900 with generally coplanar contact pads for contacting the upper and lower thermally conductive flange edges at the opposite end of the electronic modules. As should be appreciated from FIG. 8, these two conduit legs of each tier are preferably integrally formed and connected so as to form a U-shaped conduit thus minimizing the number of required fluid connections.

A typical conductive flange edge 934 of an electronic module is shown in dotted lines at FIG. 9. As should be appreciated, FIG. 9 is essentially a diagrammatic depiction intended to reveal the essential structural and functional relationships between the various components and is not intended to be a dimensionally accurate representation of SEM/ISEM flange edge dimensions, fluid conduit dimensions or the like.

As indicated by arrows 936, 938 in FIG. 9, the second and fourth tiers in this exemplary embodiment are mounted so as to permit reciprocating movement in the up and down direction. That is, the locating flanges 940-946 (also integrally formed in this exemplary embodiment with the fluid conduit) are freely slidable within the vertical channel defined by the locating flanges of the first, third and fifth tiers. In the exemplary embodiment, the locating flanges of the first, third and fifth tiers may be rigidly fixed with respect to the frame 900. As should be appreciated, the alternate first, third and fifth tiers may also be arranged for reciprocating movement in a direction generally opposite to the interleaved alternating second and fourth tiers so as to provide clamping and unclamping between the opposingly directed sets of contact pads associated with these various conduit tiers.

As should now be appreciated, if the second and fourth tiers of the exemplary embodiment shown in FIG. 9 are moved upwardly in a freeing or unclamping direction, the thermally conductive edge or flange of an electronic module within channel 932 its pin connectors may be conventionally engaged with the socket connectors 902 at the back of the frame 900. Thereafter, if the second and fourth tiers are moved in an opposite downward or clamping direction, contact pads 924-930 are moved downwardly so as to clamp the thermal conductive edge of the electronic module between the downwardly moving contact pads 924-930 and the stationary (or perhaps upwardly moving in an alternate embodiment) contact pads 912-922. Thus, each edge of the electronic module is firmly clamped between ten contact pads (six facing upward, four facing downward) in the exemplary embodiment of FIG. 9 using only five conduit tiers. As should be appreciated, the number of conduit tiers permitted depends upon the horizontal dimensions of the contact pads, conduits and electronic modules involved. In general, as many conduit tiers may be provided from front-to-back of the frame 900 as are permitted by the relative dimension of the electronic modules to be received within channel 932.

Figure 10:
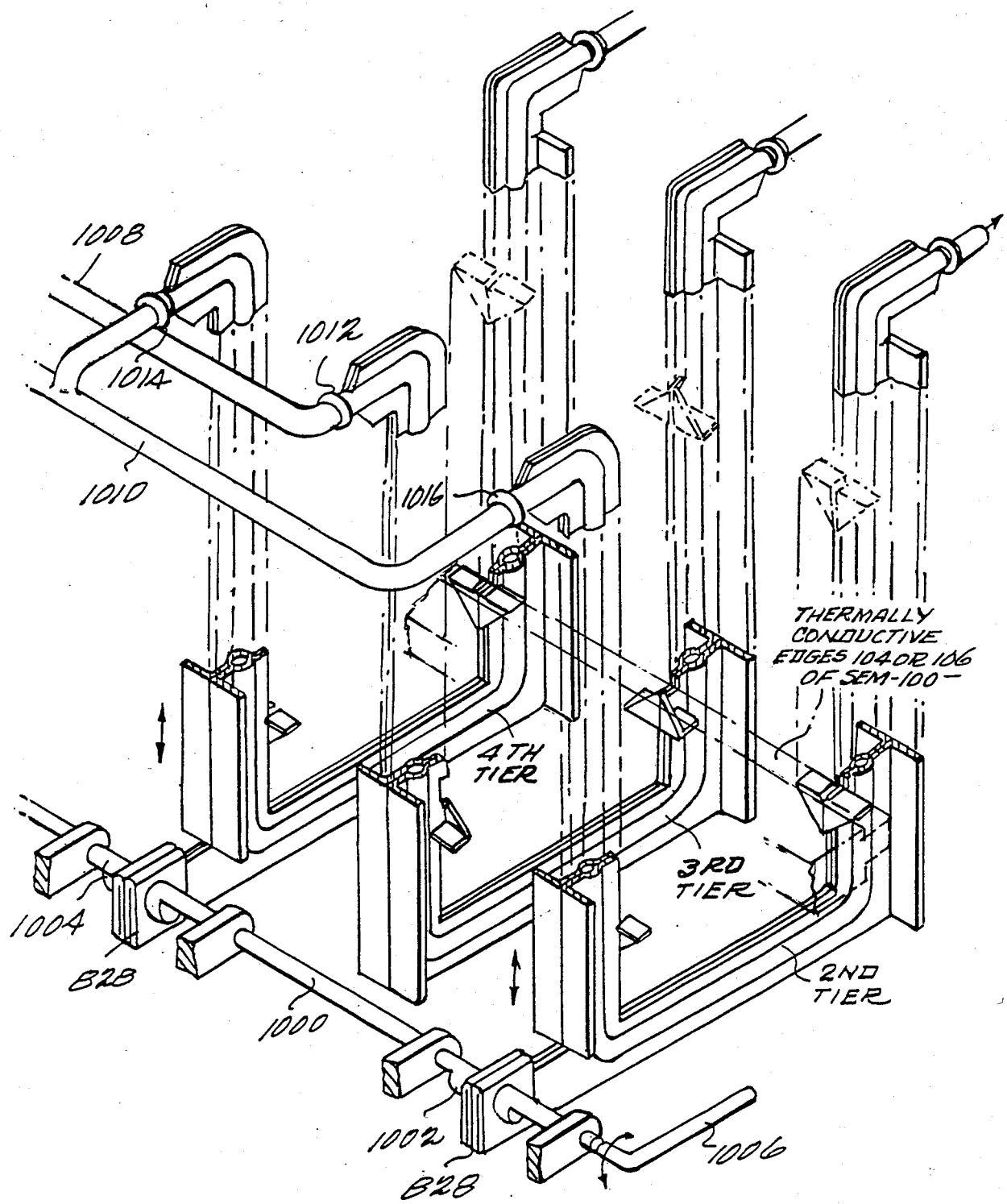
FIG. 10 is an exploded cut-away partial view of the stacked conduit tiers shown in FIG. 9 further including a generalized lever and cam arrangement typical of several possible means for moving alternate ones of those tiers with respect to the remaining interleaved tiers thus effecting the selective clamping and unclamping of electronic modules.

One exemplary mechanical arrangement for achieving the clamping and unclamping motion of the second and fourth tiers in the exemplary embodiment of FIG. 9 is shown at FIG. 10. Here, the second and fourth tiers are formed to include a cam-following aperture 832 as previously described, while the odd numbered tiers are provided with similar apertures which may serve to further support shaft 1000. In the exemplary embodiment, the shaft is relatively fixed with respect to frame 900 by any desired conventional means as previously described. Shaft 1000 is then provided with mating cam surfaces 1002, 1004 which cooperate with the cam-following apertures 832 and the guiding vertical channels or slots formed by the mounting flanges of the stationary tiers to produce reciprocating motion of the even numbered tiers (as shown by the arrows in FIG. 10) in response to the rotational motion of shaft 1000. Such rotational motion may be effected, for example, by a lever arm 1006 located in some convenient operating position. Accordingly, by simply rotating the lever 1006, the entire stack of electronic modules received transversely between the stack of conduit tiers may be simultaneously released for easy insertion/removal with respect to mating pin/socket connectors as should now be apparent. After the desired electronic modules are in place, their thermally conductive edges or flanges may thereafter be simultaneously clamped by an opposite simple rotation of lever 1006 as should now also be apparent. In addition, if the odd-numbered tiers are not fixed with respect to frame 900, then by including cam-following apertures 832 on the odd-numbered tiers and by providing appropriate mating cams on shaft 1000 (e.g. 180° offset from the cams used for the even-numbered tiers), rotation of lever 1006 will simultaneously move the interleaved sets of tiers in opposing directions.

In the exemplary embodiment, flexible fluid connections are preferably employed for at least the set of movable tiers so as to permit the necessary relative motion. As also shown in FIG. 10, such flexible conduit 1008, 1010 may be of any conventional metallic or non-metallic flexible fluid conduit design conventionally connected (e.g., by couplings or hose clamps or the like) at coupling nipples 1012–1016 formed at the entrance or exit of the fluid conduit tiers as depicted at FIG. 10.

It is believed that the exemplary system for retention of electronic modules (e.g., SEM/ISEM) is capable of exerting higher clamping forces over a greater portion of the available thermally conductive edges of the modules than any existing arrangements. These higher clamping forces and larger areas of engagement will not only improve thermal transfer characteristics but will also retain the modules more effectively in the high shock and vibration environments. The area of effective thermal contact (in the exemplary embodiment) is at least tenfold over existing art and is inherently capable of conforming more perfectly to the precise location of the module flange surface and adjust for local surface irregularities or warpage since ten separately acting spring metal pads are employed (six pads forcing the module flange in one direction and four pads forcing the module flange in the opposite direction). Thus, a unique conforming grip of the module flange is better assured.

Furthermore, since the individual pads associated with the given conduit tier are formed from the same piece of metal which contains the flowing coolant (i.e., the thermal circuit contains no additional joints), an optimum thermal interface has been achieved between the flowing coolant and the thermally conductive surfaces at the edge of the module. Indeed, the preferred embodiment actually causes the same surface of the thermally conductive metal sheet to appear in one place as the mechanical/thermal contact pad clamped against the module flange and, at another place, to be directly exposed to the flowing coolant.

It is known, in some materials, that the grain orientation affects the diffusion and analogously the heat transfer characteristics of the metal. If such metals are used to form or to plate the fluid conduit tiers, then the raw material may be optimally aligned during the forming process with respect to the molecular orientation, mill grain, etc., of the metallic sheet so as to optimize heat transfer characteristics.

Figure 11:
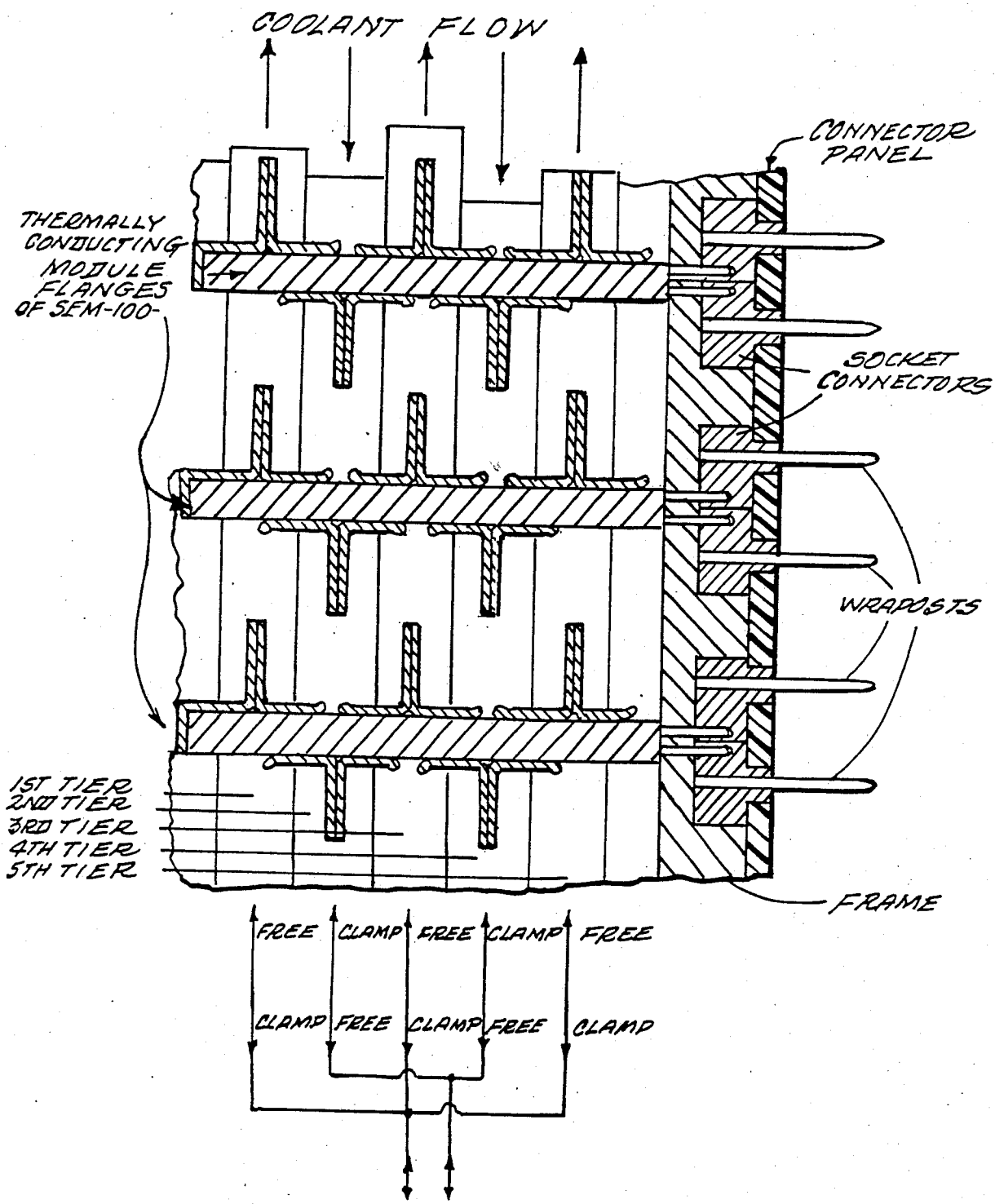
FIG. 11 is a partial sectional view of apparatus of the type shown in FIGS. 9 and 10 including the thermally conductive edge of an electronic module clamped between the opposingly directed mechanical/thermal contact pads of the stacked conduit tiers.

A partial cross-sectional view of the arrangement depicted in FIGS. 9 and 10 is shown again at FIG. 11 so as to perhaps better illustrate the clamping and unclamping (or freeing) movement of the various alternate tiers so as to permit the module frame flange to be freely inserted or removed as desired but to be firmly clamped between ten independently acting spring contact pads during normal operation.

As also indicated in FIG. 11, it is possible to connect the coolant flow circuits for the various conduit tiers so as to have the coolant flow going in opposite directions on adjacent tiers. That is, the coldest coolant would alternately be presented to the different tiers so as to help average out the heat transfer capacity over the entire stack of electronic modules. This would help avoid a situation where some modules might be mounted at a point in the stack where they are only affected by coolant that has already been substantially heated by prior heat transfer with other modules.

The reciprocating motion required to unclamp and clamp the electronic modules flanges is preferably rather small for most applications. For example, the total movement involved in some embodiments may be on the order of only 0.05–0.100 inch although the exact amount of movement will of course have to be tailored to the desired spring force and controlling dimensions in any given individual application of the invention. When any particular module flange is not in its desired position, the effective clamping force applied by the oppositely facing contact pads will be locally greater on one side of the module flange and correspondingly less on the reverse side of the flange. This will not normally be a large discrepancy as the amount of mislocation should fall within the distance where the spring rates of the pads are nearly linear.

Contact pads on various conduit tiers may well press more firmly at the top on one side of the module flange than at the bottom (pin/connector edge). Although this might cause the "toe" of a contact pad to sometimes lift away from the module flange, the added force with which the "heel" of that contact pad would thus press against the flange would normally improve the thermal conductivity across the interface so as to at least partly compensate for the smaller engagement area. The largest engagement area being that which is available when substantially the "whole footprint" of the spring pad is contacting the module surface.

Contact pressures between any spring pad and the module flange may vary with respect to any other spring pad at any other location on the module flange. The sum of left-vs-right clamping forces at any tier should however approximate the sum of left-vs-right clamping forces at any other tier. This predictable "gripping" of the module flange makes the retention of the module in the card box or chassis more positive. Because the pin/connector interface is permitted to dictate the location of the module and the thermal spring pads are compliant, the stresses induced along the pin/connector edge of the module are drastically reduced as compared to the interposing wedge or eccentric pin clamping systems cited in the art. A highly damped (firm but gentle) restraining of the module in the shock and vibration environment is more conducive to functional reliability than a system which positively locates the edge flanges of the module frame without accounting for mislocation of the positive stop (edge of a slot in a rigid rail) with respect to the vital and usually fragile electrical leads entering or leaving the module at the pin/connector interfaces. Additionally, the substrate (electrically insulating layer on which circuit elements are mounted) is frequently a fired ceramic material which cannot be bent or warped very far without fracturing. The module frames cannot therefore be "forced" into a mechanical/thermal engagement by devices which incorporate large mechanical advantage type camming or eccentric actuating means. At least not without risking functional damage to the module electrical circuits.

The spring rate of the contact pads from pad-to-pad, tier-to-tier should be consistent since the stamping die or other forming technique should precisely punch out or otherwise form strictly uniform shapes of contact pads. The spring bend contours can be conventionally calculated and set so as to exert a relatively linear force throughout the nominal range of expected movement (e.g., possibly as little as 0.050 inch and not likely more than 0.12 inch in one exemplary embodiment). The gauge (metal thickness) and conventional heat treatment are other parameters which may be conventionally used to control the desired spring performance.

The earlier discussed prior art arrangements would typically engage the side of a guide slot with a module flange at only one line or point of thermal contact. The spring in such prior art arrangements which may be used to force the module flange into such line or point contact may also touch the opposite side of the module flange at two, three or more points but the spring itself is normally not thermally integral with the guide rail through which the coolant is passing so heat transfer into the spring has at least one and may have more than one thermal discontinuity to bridge before passing the thermal load into the flowing coolant.

On the other hand, the exemplary embodiment of this invention as just described "touches" the module flange at at least ten lines or points (six on one side and four on the other) at each of the module flanges. Since, in the exemplary embodiment, the metal "touching" the module flanges is the same metal "touching" the flowing coolant, there are no additional thermal discontinuities. Furthermore, the point and line contacts between each of the ten contact pads and the module flange are individually controlled by independently acting spring forces and thus able to incrementally conform so as to optimize the probability that there is an actual area of thermal contact larger than a theoretical point or line of contact and thus optimize the efficiency with which heat is conducted to the flowing coolant.

In the exemplary embodiment, coolant flow direction is totally independent of the locking/unlocking motion. Furthermore, the multiple tier arrangement may be adapted for either horizontal or vertical arrays of standard electronic modules as should be readily apparent from the above discussion. Although the alternate interleaved sets of fluid conduit tiers may be simultaneously moved in opposing directions so as to clamp and unclamp the transversely disposed array of electronic modules, the required motion and articulated or flexible coolant plumbing connections are simplified by merely keeping one of the two sets fixed with respect to the frame of the overall system.

This particular arrangement also permits great flexibility in optimizing the overall coolant flow circuit so as to ensure better overall or average cooling of the electronic modules. For example, typical prior art coolant flow circuits shown in FIG. 12 and 13 may be used to accommodate two different sizes of electronic modules. As shown in FIG. 12, a row of wider 2A modules and two rows of narrower 1A might be conventionally conductively cooled by passing liquid through the frame guide rails as indicated. However, if only a half row of the wider 2A modules are involved, it would be necessary to provide a stub guide rail as shown in FIG. 13. With conventional systems, introducing coolant into the stub guide rail might be unduly complicated if not impossible and thus would probably be omitted. If so, all of the 1A modules on either side of the stub guide rail would be denied cooling at the ends which interface with the stub guide rail. This is even more serious when the overall fluid coolant circuit is fixed as shown in FIGS. 12 and 13 so that the coolant reaching the 1A modules interfaced with the stub guide rail has already been heated to some extent by cooling both of the full rows of 1A modules.

A schematic diagram of one possible fluid coolant circuit made possible by this invention is depicted in FIG. 14. The coldest input coolant is provided in a header conduit 1400 connected in parallel to the input of the various tiers of fluid conduits. A similar "hot" coolant output header 1402 is provided and connected in parallel across the various tiers of conduit. As depicted in FIG. 14, each conduit tier provides for three module bays as for instance in FIG. 12 (i.e. each planar conduit tier comprises four vertical conduit legs with integrally formed interconnections and with integrally formed contact spring pads on both sides of the two inside legs).

In accordance with the earlier description, in this exemplary embodiment the various tiers of conduits shown in FIG. 14 would in fact be stacked one behind the other so as to form an arrangement such as that shown in FIGS. 9 and 10. However, as shown in FIG. 14, the first tier may be connected so that the coldest coolant begins to cool the lowermost modules in bay 1 first before proceeding to cool other successively encountered modules in bays 1, 2 and 3. On the other hand, tier 2 is connected so as to pass the coldest coolant to first cool the uppermost module in bay 1 before passing on to cool other successively encountered modules in bays 1, 2 and 3. Tier 3, on the other hand, is connected so that the coldest coolant first cools the lowermost module in bay 3 before going on to encounter other successive modules in a reverse direction through bays 3, 2 and 1. Finally, tier 4 is connected so that the coldest coolant first cools the uppermost module in bay 3 before going on to cool successively encountered modules in bays 3, 2 and 1. As should be appreciated, the coolant input/output connections for any given conduit tier can be arranged so as to permit other arrangements as well (e.g., where the coolant begins at some internal bay and works its way in one direction and/or the other before finally being output from that particular conduit tier. By designing the conduit tiers in this manner and/or by interconnecting them in such configurations, the average efficiency with which heat can be conducted away from a module can be made less dependent upon the relative physical position of a particular module within the overall equipment as should now be apparent.

Figure 15:
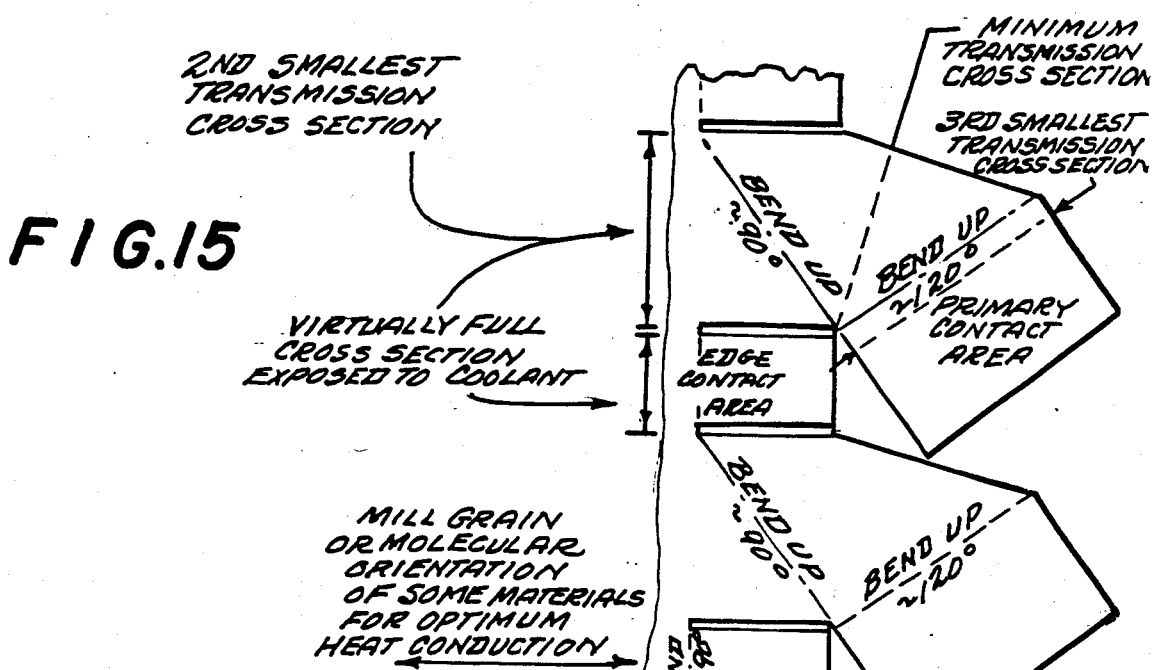
FIG. 15 is a plan view of an alternate metal edge cutting, bending and orientation procedure for producing maximum thermal contact area and efficiency in transferring heat to the fluid coolant in a conduit tier of this invention.

An optimized thermal efficiency for the integrally-formed contact pads along an edge of a conduit tier can be realized by cutting out and bending the conduit edge areas as shown in FIG. 15. As will be seen, the segment between bend lines is widened to provide the maximum cross-sectional area and hence the maximum heat transfer capability. Any further widening of this segment would cause the primary contact area to be reduced as should be apparent from FIG. 15. If thermal conduction is maximized along the mill grain or along a particular molecular orientation, then this optimum thermal conduction orientation should be oriented as shown in FIG. 15 to optimize overall thermal efficiency.

An additional module edge-contacting spring contact area or pad may also be optionally formed from what would otherwise be a cut-away area. As shown in FIG. 15, these edge-contacting areas can be interspersed between the pads used to form the primary contact areas. They can be bent to form auxiliary spring contact pads designed to contact the extreme outer edge surfaces of the thermally conducting module flanges thus even further increasing the total heat transfer capability of the assembly. If in addition to the primary thermal spring pads operating against the sides of the module frame, and the additional module edge-contacting spring pads, a supplementary engagement of the shoulders of the module can be included by bending the tabs as shown in either FIG. 6 or as in FIGS. 7 and 17. Depending on the precise contour of these auxiliary edge-contacting pads for optimum thermal performance, they may introduce some frictional resistance to insertion/withdrawal forces.

Figure 16:
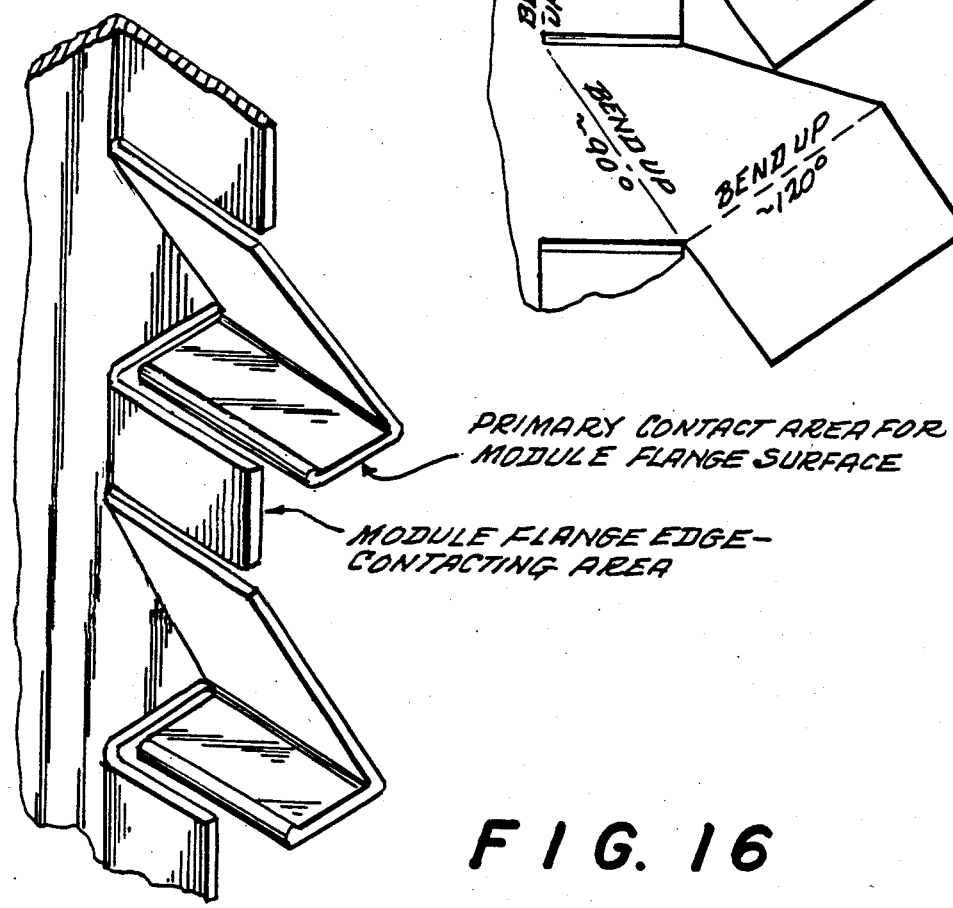
FIG. 16 is a perspective view of the contact pads on the edge of a conduit tier formed in accordance with FIG. 15.

A perspective view of the final formed edge contact areas depicted in FIG. 15 is shown at FIG. 16. As can be seen, this arrangement would provide thermal contact with the outer edge and one adjacent surface of the thermally conductive portion of the module flange. If a stacked array of mating tiers is constructed in this manner and employed as earlier described, thermal contact would be provided with substantially all of the outer edge surface and both (upper and lower) adjacent surfaces of the module flange as should now be apparent.

In addition to merely bearing against the surfaces on either side at the edges of the module, the spring pad furthest from the pin/connector edge of the module (furthest to the left in FIG. 11) may be formed by bending a return lip (as shown in FIGS. 20A and 20B) so that when that tier is moved into engagement with the module (downward in FIG. 11) it provides a positive hook which prevents accidental disengaging motion in the module.

While only a few exemplary embodiments of the invention has been described in detail above, those ordinarily skilled in the art will understand that there are many possible variations and modifications of this exemplary embodiment which would still include one or more of the novel and advantageous features of the invention. Accordingly, all these modifications and variations are intended to be included within the scope of the following appended claims.

What is claimed is:

1. Method for selectively clamping the edges of an array of plural electronic modules into mechanical and thermal contact with a fluid coolant circuit, said method comprising the steps of:

providing a stack of plural substantially parallel generally planar fluid conduit-containing structures having spaced-apart legs, each said structure having mechanical/thermal contact pads disposed approximately perpendicular to its general plane on the inside edges of said parallel legs, said contact pads being directed in one direction on some of said structures and in an opposite direction on others of said structures;

moving at least said some structures in a first direction so as to permit unobstructed insertion of a stack of electronic modules transversely of said structures with the module edges being disposed between said opposingly directed contact pads; and moving at least said some structures in a second direction opposite said first direction to selectively clamp the edges of said stack of electronic modules between said opposingly directed contact pads.

2. A method for releasably retaining an array of plural electronic modules in thermal and mechanical contact with a frame structure including conduit for passage of a fluid coolant, said method comprising the steps of:

providing a first plurality of substantially parallel clamp members, each having an included fluid coolant conduit and plural spaced-apart projecting tabs directed in a first direction, providing a second plurality of substantially parallel clamp members, each having an included fluid coolant conduit and plural spaced-apart projecting tabs directed in a second direction generally opposite to said first direction, at least one of the plurality of clamp members being capable of reciprocating movement along said first and second directions, the individual clamp members of said first and second plurality of clamp members being interleaved with one another and defining channels between their corresponding but oppositely directed projecting tabs for receiving the edges of respective electronic modules;

collectively moving at least one of said first and second pluralities of clamp members away from the other to permit insertion and withdrawal of electronic modules along said channels; and collectively moving at least one of said first and second pluralities of clamp members toward the other to mechanically and thermally clamp the edges of electronic modules located within said channels between their oppositely directed projecting tabs.

3. A method as in claim 2 wherein said providing steps each comprise shaping and forming sheets of metal and bonding mating pairs of such sheets together along the boundary of mated depressions therein to form the included fluid conduit.

4. A method as in claim 3 wherein said providing steps further comprise bending cut-out portions of the edge of said sheets of metal substantially adjacent said boundary of mated depressions to form said projecting tabs.

5. A method as in claim 4 wherein said providing steps comprises:

bonding at least one additional metal layer between said two sheets of metal along the boundary of the mated depressions and leaving an edge of the additional metal layer extending into said included conduit so as to increase the surface area available therewithin for thermal contact with a fluid coolant.

6. A method as in claim 2 wherein said collective movement steps comprise rotating a cam surface in simultaneous contact with each of at least one of the plurality of clamp members.

7. A method for constructing coolant fluid conduit and clamping apparatus for use in cooling an array of generally planar electronic modules and in physically retaining in place and array of plural parallel said modules, said method comprising the step of:

bonding two elongated sheets of spring metal together along the boundaries of mating elongated indentations to create a fluid conduit therewithin;

bending at least one side of the edges of said sheets along such conduit into pairs of first spring pads having contact surfaces at regular intervals therealong for engaging the surface of an electronic module wherein said bending step comprises cutting and bending further edge-contacting spring pads aligned approximately perpendicular to said contact surfaces of said first pads and also approximately perpendicular to the longitudinal axis of said fluid conduit for engaging the edge of an electronic module.

8. A method for cooling an array of generally planar electronic modules, said method comprising:
providing an array of integrally formed pressure pads along an edge of a first metal fluid conduit for thermal contact with a first surface of said module;
providing a second array of integrally formed pressure pads along an edge of a second metal fluid conduit oppositely directed from the pads in said first array for thermal contact with a second surface said module opposite and parallel to said first surface; and
moving at least one of said fluid conduits in a direction substantially perpendicular to said pads and to said modules so as to clamp said opposing module surfaces between said first and second arrays.

9. A method as in claim 8 wherein said providing steps each comprise forming an array of module edge-contacting integrally formed spring pads interleaved with said pressure pads and disposed substantially perpendicular thereto and placed in contact with the edges of said modules perpendicular to said first and second surfaces thereof.

10. A method as in claim 9 wherein each of said pressure pads are formed by making at least two bends in a cut away portion in an edge of their respective elongated metal layer and wherein said module edge-contacting spring pads are formed by making at least one bend in a cut away portion in an edge of their respective elongated metal layer.

* * * * *